United States Patent
Oi et al.

(10) Patent No.: US 7,414,309 B2
(45) Date of Patent: Aug. 19, 2008

(54) ENCAPSULATED ELECTRONIC PART PACKAGING STRUCTURE

(75) Inventors: Kiyoshi Oi, Nagano (JP); Noriyoshi Shimizu, Nagano (JP); Yasuyoshi Horikawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/593,538

(22) Filed: Nov. 7, 2006

(65) Prior Publication Data

US 2007/0052086 A1 Mar. 8, 2007

Related U.S. Application Data

(62) Division of application No. 11/122,098, filed on May 5, 2005, now Pat. No. 7,229,856.

(30) Foreign Application Priority Data

May 17, 2004 (JP) ............................. 2004-146406

(51) Int. Cl.
*H01L 23/12* (2006.01)
*H01L 21/00* (2006.01)

(52) U.S. Cl. ................. 257/700; 257/758; 257/774; 257/E23.008; 257/E23.019; 257/E23.169; 438/622

(58) Field of Classification Search .................. None
See application file for complete search history.

(56) References Cited

U.S. PATENT DOCUMENTS

| | | | | |
|---|---|---|---|---|
| 5,745,984 A * | 5/1998 | Cole et al. | ...................... | 29/834 |
| 6,025,995 A * | 2/2000 | Marcinkiewicz | ............ | 361/760 |
| 6,921,977 B2 * | 7/2005 | Shimizu et al. | ............. | 257/758 |
| 6,930,392 B2 * | 8/2005 | Sunohara et al. | ............ | 257/758 |
| 7,084,006 B2 * | 8/2006 | Sunohara et al. | ............ | 438/106 |
| 7,217,888 B2 * | 5/2007 | Sunohara et al. | ............ | 174/260 |
| 7,250,389 B1 * | 7/2007 | Sakanaka et al. | ............ | 504/140 |
| 2006/0065980 A1* | 3/2006 | Yabuki | ........................ | 257/758 |

FOREIGN PATENT DOCUMENTS

JP 03156905 A * 7/1991
JP 2000-323645 11/2000

* cited by examiner

*Primary Examiner*—Alonzo Chambliss
(74) *Attorney, Agent, or Firm*—Edwards Angell Palmer & Dodge LLP

(57) ABSTRACT

An encapsulated electronic part packaging structure includes a step of mounting an electronic part having a connection terminal and a passivating film to cover the connection terminal, mounted on a body to direct the connection terminal upward. An insulating layer is formed to cover the electronic part, and a via hole is formed in a portion of the passivating film and the insulating layer on the connection terminal to expose the connection terminal. A wiring pattern, which is connected electrically to the connection terminal via the via hole, is formed on the insulating layer.

6 Claims, 11 Drawing Sheets

ENCAPSULATED ELECTRONIC PART PACKAGING STRUCTURE

CROSS-REFERENCE TO RELATED APPLICATIONS

This application is a divisional application of U.S. Ser. No. 11/122,098, filed on May 5, 2005 now U.S. Pat. No. 7,229,856, and is based on and claims priority of Japanese Patent Application No. 2004-146406 filed on May 17, 2004, the entire contents of which are incorporated herein by reference.

BACKGROUND OF THE INVENTION

1. Field of the Invention

The present invention relates to an electronic part packaging structure and, more particularly, an electronic part embedded in an insulating layer and mounted.

2. Description of the Related Art

In the prior art, there is an electronic part packaging structure having a structure in which the electronic part such as the semiconductor chip, the stacked capacitor chip, or the like is embedded in the insulating layer. As shown in FIG. 1, in a semiconductor chip 100 in the prior art, a predetermined element (not shown) such as a transistor, or the like and connection pads 112 connected thereto are provided on the element forming surface side of a semiconductor substrate 110. Also, a passivating film 104 in which opening portions 104x are provided on the connection pads 112 is formed on the semiconductor chip 100, and also a contact portion 112a made of an Ni/Au layer is formed on the connection pads 112 in the opening portions 104x, respectively.

Then, as shown in FIG. 2, bumps 108 made of solder, or the like are provided in the contact portions 112a of the semiconductor chip 100 having such a structure. Then, a circuit board 200 having through electrodes 202 and wiring patterns 204 connected to the through electrodes 202 is prepared, and then the bumps 108 of the semiconductor chip 100 are flip-chip connected to the wiring patterns 204. Then, an underfill resin 210 is filled in a clearance between the semiconductor chip 100 and the circuit board 200, and then an interlayer insulating film 212 for covering the semiconductor chip 100 is formed.

Then, via holes 212x are formed in the interlayer insulating film 212 on the wiring patterns 204, and then upper wiring patterns 204a connected to the wiring pattern 204 via the via hole 212x are formed. In this manner, the semiconductor chip 100 is mounted such that the connection pads 112 are connected electrically to the wiring patterns 204 on the circuit board 200 in a state such that the semiconductor chip 100 is embedded in the interlayer insulating layer 212.

In this event, in some cases the semiconductor chip 100 is mounted onto the circuit board 200 to direct the connection pads 112 upward and then the contact portions 112a and the wiring patterns 204 of the circuit board 200 are connected via wires.

Also, as shown in FIG. 3, in a stacked capacitor chip 300 in the prior art, a plurality of first electrode layers 302 and a plurality of second electrode layers 304 are stacked via a dielectric layer 306 to constitute a capacitor portion. The first electrode layers 302 are connected to a first connection terminal 310, and the second electrode layers 304 are connected to a second connection terminal 312. Then, a protection layer 308 is provided on an uppermost surface and a lowermost surface of the capacitor portion of the stacked capacitor chip 300 respectively.

Then, as shown in FIG. 4, in the stacked capacitor chip 300 having such a structure, a bump 118 is provided on bottom surfaces of the first connection terminal 310 and the second connection terminal 312, respectively. Then, the bumps 118 of the stacked capacitor chip 300 are connected electrically to the wiring patterns 204 of the same circuit board 200 as in FIG. 2. Then, the interlayer insulating film 212 for covering the stacked capacitor chip 300 is formed and, like FIG. 2, the upper wiring patterns 204a connected to the wiring pattern 204, respectively, via the via hole 212x provided in the interlayer insulating film 212 are formed on the interlayer insulating film 212. In this manner, the stacked capacitor chip 300 is mounted such that the first and second connection terminals 310, 312 are connected electrically to the wiring patterns 204 on the circuit board 200 in a state such that the stacked capacitor chip 300 is embedded in the interlayer insulating layer 212.

Also, as the technology connected with the electronic part packaging structure in above FIG. 2, in Patent Literature 1 (Patent Application Publication (KOKAI) 2000-323645), there is set forth a semiconductor device having a structure such that a plurality of semiconductor chips are mounted three-dimensionally on the circuit board in a state that these chips are embedded in the insulating layer and also these semiconductor chips are connected mutually by wiring patterns that are formed in a multi-layered fashion via insulating layers.

As described above, in the electronic part packaging method in the prior art, such a premise is assumed that the semiconductor chip 100 is connected electrically to the wiring patterns 204 on the circuit board 200 via the flip-chip connection or the wire bonding. Therefore, the connection pads 112 (contact portions 112a) must be exposed by providing the opening portions 104x in the passivating film 104 of the semiconductor chip 100. For this reason, a problem lies such that the passivating film 104 is limited to material that is easily patterned and is relatively expensive such as photosensitive resin, printable insulating material, or the like.

In addition, in the semiconductor chip 100 in the prior art, the contact portion (Ni/Au layer) 112a must be particularly provided on the connection pads 112 to prevent corrosion of the connection pads 112 and to insure the reliability of the electrical connection between the connection pads 112 and the bumps 108. As a result, such provision of the contact portions acts as one factor that results in an increase of cost.

Further, in the stacked capacitor chip 300 in the prior art, the first and second connection terminals 310, 312 made of copper, or the like are not covered with the passivating film and are held in an exposed condition. Therefore, the situation in which corrosion resistance is poor and the reliability becomes an issue may be supposed.

SUMMARY OF THE INVENTION

It is an object of the present invention to an encapsulated electronic part packaging structure, and an electric, capable of electrically connecting a connection terminal of an electronic part and a wiring pattern at a low cost and with good reliability even though various passivating films are employed without any limitation, in the case where the electronic part having the passivating film is embedded in an insulating layer and mounted.

The present invention is concerned with a method of manufacturing an encapsulated electronic part packaging structure, which comprises the steps of mounting an electronic part, which has a connection terminal and a passivating film to cover the connection terminal, on a mounted body to direct the connection terminal upward; forming an insulating layer to cover the electronic part; forming a via hole in a portion of the passivating film and the insulating layer on the connection terminal to expose the connection terminal; and forming a wiring pattern, which is connected electrically to the connection terminal via the via hole, on the insulating layer.

In the present invention, first an electronic part (semiconductor chip, or the like), on an uppermost surface of which the passivating film for covering the connection terminal is provided, is prepared, and then the electronic part is mounted onto the mounted body to direct the connection terminal of the electronic part upward (face up). Then, the insulating film for covering the electronic part is formed. Then, portions of the passivating film and the insulating film on the connection terminal of the electronic part are processed by a laser, or the like, and thus via holes are formed on the connection terminal of the electronic part. In this stage, the connection terminal of the electronic part is exposed, and also the wiring pattern connected to the connection terminal via the via hole is formed on the insulating layer.

Because such a method is employed, there is no necessity to form the opening portion which exposes the connection terminal in the passivating film of the electronic part at a stage prior to mounting of the electronic chip. Therefore, the passivating film is not limited to an insulating material that is easily patterned, and a wide variety of insulating layers may be chosen appropriately to meet the purpose such that the passivating film with a high reliability is chosen, the passivating film capable of attaining a reduction in cost is chosen, etc.

In addition, there is no necessity of providing the contact portion (Ni/Au layer) on the connection terminal. Therefore, the connection terminal can be made of inexpensive Cu or Al and thus a reduction in cost of the electronic part can be attained.

Also, the present invention is concerned with an electronic part which comprises a connection terminal connected electrically to a wiring pattern; and a passivating film for covering the connection terminal; wherein, when the electronic part is mounted on a mounted body, the electronic part is embedded in an insulating layer and mounted to direct the connection terminal upward and also the connection terminal is connected electrically to the wiring pattern via a via hole that is provided in the insulating layer and the passivating film.

The electronic part of the present invention is employed in the above method of manufacturing the electronic part packaging structure. Preferably, as the passivating film of the present invention, a non-photosensitive resin layer or an inorganic insulating layer is employed.

As described above, according to the present invention, various insulating materials can be employed as the passivating film of the electronic part. Also, because the method of forming the opening portion in the passivating film after the electronic part is embedded in the insulating layer and mounted is employed, the electronic part packaging structure that has a high reliability and is excellent in electric characteristics can be manufactured easily.

DETAILED DESCRIPTION OF THE PREFERRED EMBODIMENTS

Embodiments of the present invention will be explained with reference to the accompanying drawings hereinafter.

(First Embodiment)

Figure 1:
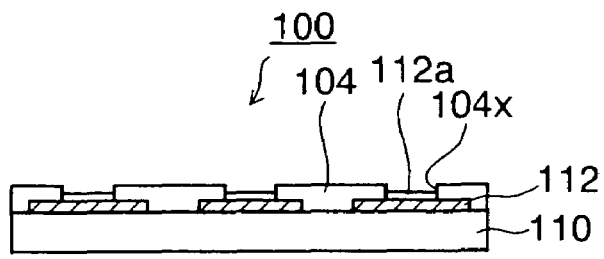
FIG. 1 is a sectional view showing a semiconductor chip according to the prior art.
Figure 2:
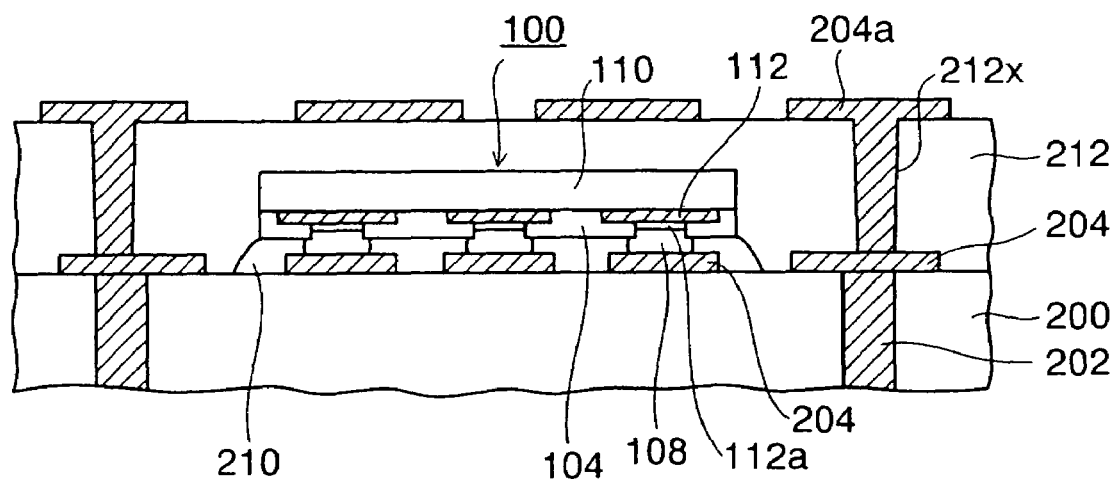
FIG. 2 is a sectional view showing an electronic part packaging structure in which the semiconductor chip according to the prior art is embedded in an insulating layer and mounted.
Figure 3:
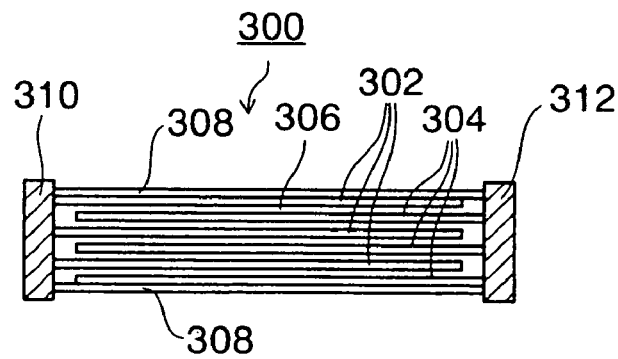
FIG. 3 is a sectional view showing a stacked capacitor chip according to the prior art.
Figure 4:
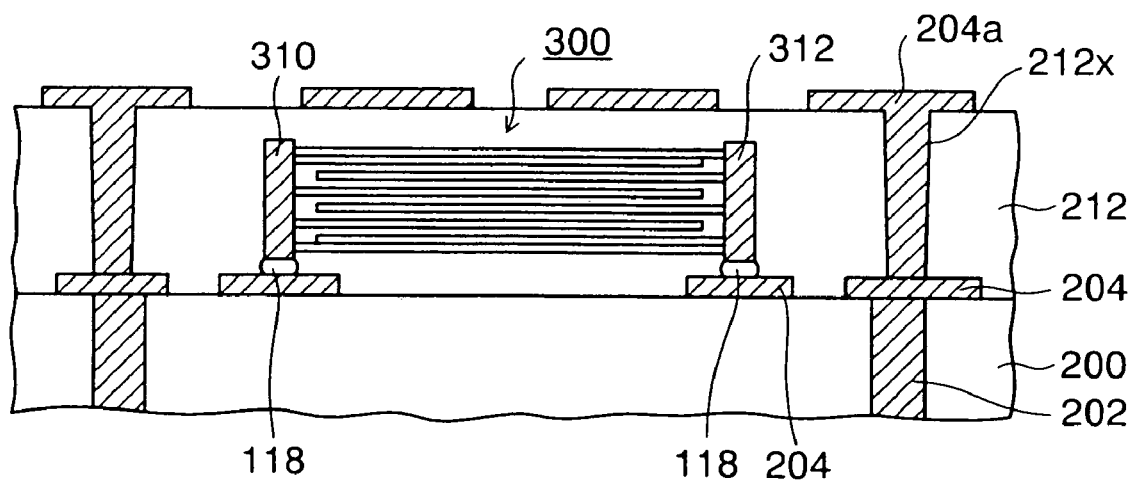
FIG. 4 is a sectional view showing an electronic part packaging structure in which the stacked capacitor chip according to the prior art is embedded in an insulating layer and mounted.
Figure 5:
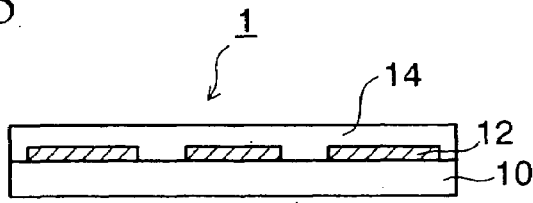
FIG. 5 is a sectional view showing a semiconductor chip (electronic part) according to a first embodiment of the present invention.
Figure 6:
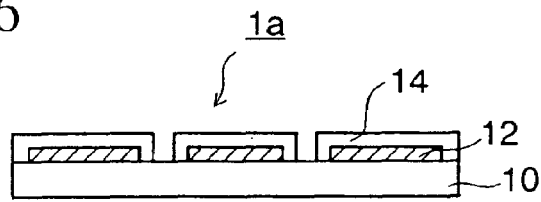
FIG. 6 is a sectional view showing a semiconductor chip (electronic part) according to a variation of the first embodiment of the present invention.

FIG. 5 and FIG. 6 are sectional views showing an electronic part according to a first embodiment of the present invention respectively, and FIGS. 7A to 7D are sectional views showing a method of manufacturing an electronic part packaging structure according to the first embodiment of the present invention. In the first embodiment, explanation will be made while taking a semiconductor chip as an example of the electronic part hereunder.

As shown in FIG. 5, in a semiconductor chip 1 (electronic part) of the first embodiment, a predetermined element (not shown) such as a transistor, or the like and connection pads 12 (connection terminals) connected electrically thereto via a multi-layered wiring (not shown) are formed on the element forming surface side of a semiconductor substrate 10 such as a silicon substrate. Then, a passivating film 14 for covering the connection pads 12 is formed over the entire surface on the element forming surface side. That is, no opening portion for exposing the connection pads 12 is formed in the passivating film 14 of the semiconductor chip 1 in the present embodiment.

As described later, the semiconductor chip 1 is mounted on the mounted body to direct the connection pads 12 upward (face up) in a state such that the semiconductor chip is embedded in the insulating layer, then opening portions are formed in the passivating film 14 and the insulating layer on the connection pads 12, and then the connection pads 12 and wiring patterns are connected electrically mutually.

Therefore, there is no necessity to pattern the passivating film 14 at a stage prior to the mounting of the semiconductor chip 1. As a result, the passivating film 14 is not limited to the photosensitive material, the printable material, or the like, and thus various insulating materials can be employed.

As the material of the passivating film 14 of the semiconductor chip 1 in the present embodiment, the organic insulating material such as epoxy resin, polyimide resin, phenol resin, novolak resin, or the like, in addition, the inorganic insulating material such as silicon dioxide ($SiO_2$), silicon nitride (SiN), silicon oxide nitride (SiON), aluminium oxide ($Al_2O_3$), tantalum oxide ($Ta_2O_5$), or the like may be employed.

For example, a film thickness of the passivating film 14 is set to 1 to 100 μm when the organic insulating material is employed and also set to 0.01 to 10 μm when the inorganic insulating material is employed.

Also, as the film forming method of the passivating film 14, a wide variety of methods may be employed. For example, a film forming method such as the method of forming the insulating material by means of the spin coating or the printing, the method of laminating an insulating film, the method of dipping the semiconductor chip into a solution containing the insulating material, the sputter method, the CVD method, the vapor deposition, or the like may be employed.

In this case, the semiconductor chip 1 is obtained by grinding a back surface of a semiconductor wafer (not shown), which has a predetermined element and the connection pads 12 on the element forming surface side, to reduce a thickness to about 150 μm (preferably, about 50 μm or less, and then dividing the semiconductor wafer into individual pieces by the dicing. Therefore, the passivating film 14 may be formed on the semiconductor wafer or may be formed after the semiconductor chip is obtained.

Also, as described above, in the semiconductor chip in the prior art, because the opening portions are provided in the passivating film on the connection pads, the connection pads must be covered with the contact portion (Ni/Au layer) not to expose the connection pads when such connection pads are made of Al or Cu that is easily corrodible. Also, the Ni/Au layer is needed as the contact portion in providing the bumps made of the solder, or the like on the connection pads of the semiconductor chip.

However, in the semiconductor chip 1 in the present embodiment, because the connection pads 12 are covered with the passivating film 14 as a whole, there is no possibility that the corrosion, and the like are caused in the connection pads 12 even when the connection pads 12 are made of Al or Cu. Also, as described later, because the semiconductor chip 1 is embedded in the insulating layer and mounted, then via holes are opened on the connection pads 12 by a laser, or the like, and then the wiring patterns are connected electrically to the connection pads 12 via the via holes, the contact portion (Ni/Au layer) may not be formed.

In this manner, in the semiconductor chip 1 in the present embodiment, a cost reduction of the semiconductor chip can also be achieved from the viewpoint that there is no need to form the contact portion (Ni/Au layer) on the connection pads 12.

A semiconductor chip 1a according to a variation of the first embodiment is shown in FIG. 6. In the semiconductor chip 1a according to the variation, upper surfaces and both side surfaces of the connection pads 12 (containing the wiring patterns connected thereto) are covered selectively with the passivating film 14, and the insulating layer associated with the multi-layered wiring is exposed from other portions. The passivating film 14 of the semiconductor chip 1a according to the variation is obtained by forming selectively the above insulating layer on the exposed surfaces of the connection pads 12 by means of an electrodeposition method, or the like.

Here, the chip size package (wafer level package) obtained by the wafer level package manufacturing method may be employed as the semiconductor chip 1. In this case, the re-wiring layer having the connection pads 12 is formed on the semiconductor wafer, and the passivating film 14 for covering the connection pads 12 is provided before or after the dicing is applied to the semiconductor wafer.

Next, a method of mounting the above semiconductor chip 1 in FIG. 5 will be explained hereunder.

Figure 7A:
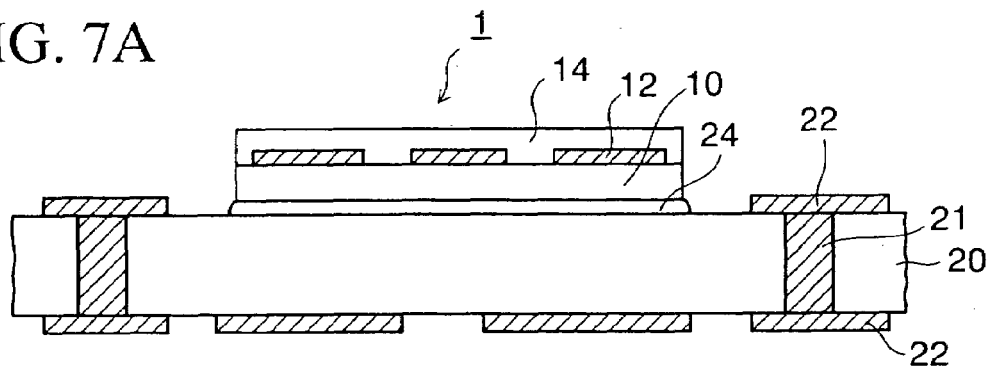
FIGS. 7A to 7D are sectional views showing a method of manufacturing an encapsulated electronic part packaging structure according to the first embodiment of the present invention.

First, a core substrate 20 (mounted body) as shown in FIG. 7A is prepared. This core substrate 20 is made of an insulator such as glass epoxy resin, or the like, then through electrodes 21 passing through this substrate are provided in the core substrate 20, and then first wiring patterns 22 that are connected mutually via the through electrodes 21 are formed on both surface of the core substrate 20 respectively.

Then, the back surface of the semiconductor chip 1 is secured onto the core substrate 20 via an adhesive layer 24 to direct the connection pads 12 of the above semiconductor chip 1 upward (face up).

Figure 7B:
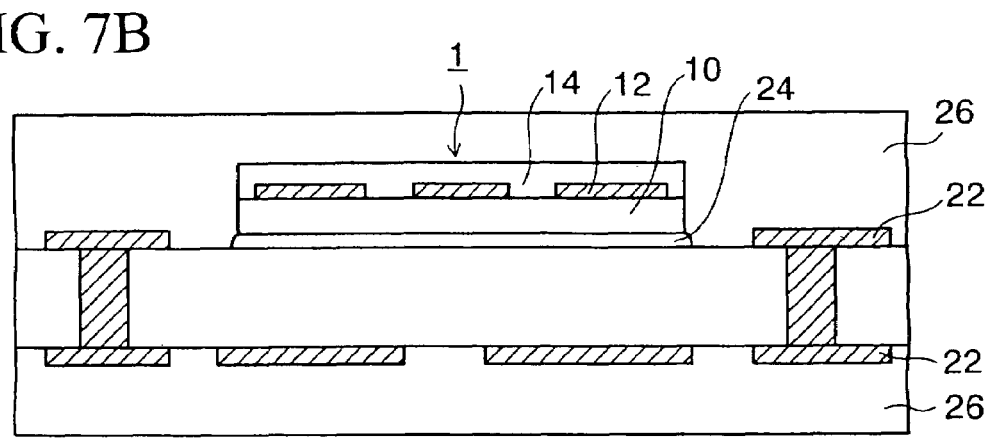

Then, as shown in FIG. 7B, an interlayer insulating layer 26 for covering the semiconductor chip 1 is formed on the upper surface side of the core substrate 20. As the interlayer insulating layer 26, preferably the epoxy resin, the polyimide resin, the polyphenylene ether resin, or the like should be employed. As the film forming method, there are the method of laminating a resin film, the method of forming a resin film by the spin coating or the printing, and others. At this time, the interlayer insulating layer 26 for covering the first wiring patterns 22 is also formed on the lower surface side of the core substrate 20.

Figure 7C:
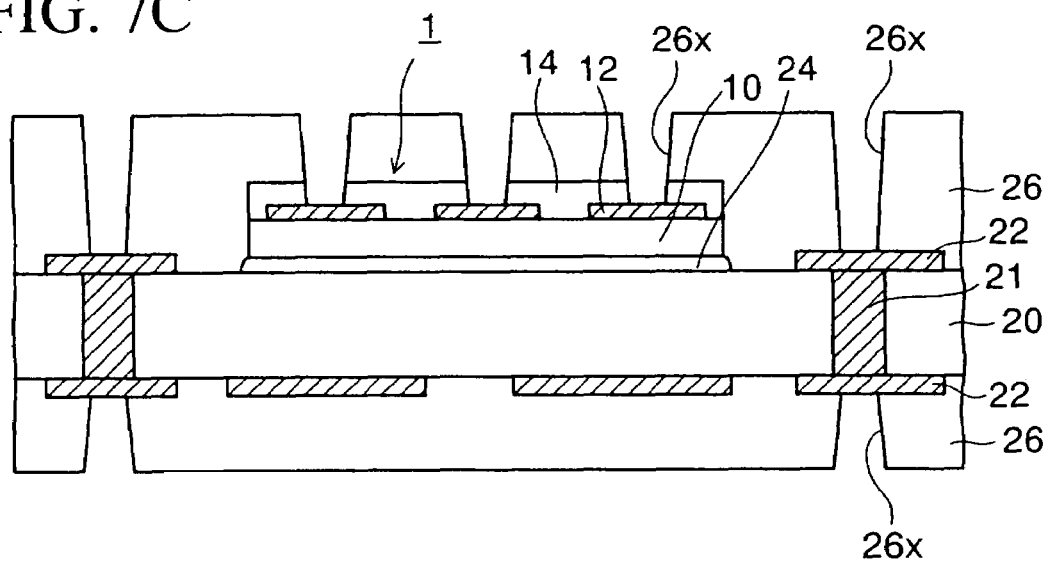

Then, as shown in FIG. 7C, portions of the passivating film 14 and the interlayer insulating layer 26 on the connection pads 12 of the semiconductor chip 1 and portions of the interlayer insulating layer 26 on the first wiring patterns 22 are processed by the lasers, respectively. Thus, first via holes 26x each having a depth that comes up to the connection pad 12 of the semiconductor chip 1 or the first wiring pattern 22 are formed. The first via holes 26x may be formed by photo-lithography and etching (RIE) instead of the laser.

In the present embodiment, the connection pads 12 of the semiconductor chip 1 are exposed at this stage. Also, the first via holes 26x having a depth that comes up to the first wiring pattern 22 are formed in the interlayer insulating layer 26 on the lower surface side of the core substrate 20. In the present embodiment, even though the connection pads 12 of the semiconductor chip 1 are made of Al or Cu, second wiring patterns described later can be formed immediately after the first via holes 26x are formed. Therefore, such defects are not caused that the connection pads 12 of the semiconductor chip 1 are corroded, and the like.

Figure 7D:
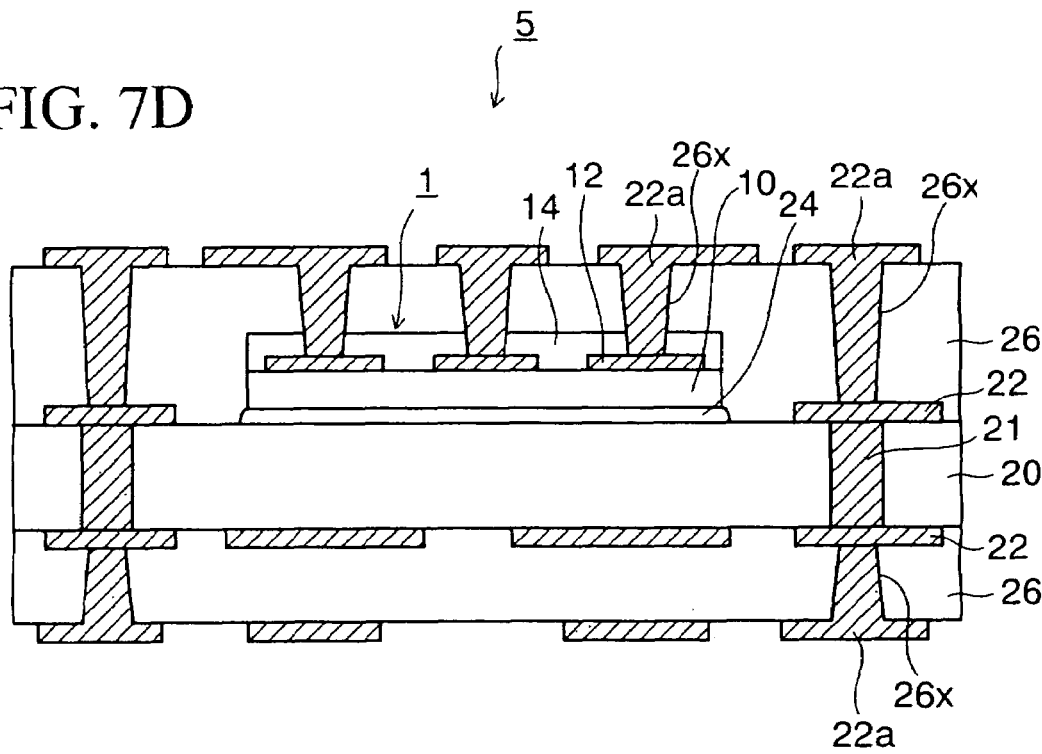

Then, as shown in FIG. 7D, second wiring pattern 22a each connected to the connection pad 12 of the semiconductor chip 1 and the first wiring pattern 22 via first via hole 26x are formed on the interlayer insulating layer 26 on the upper surface side of the core substrate 20.

The second wiring pattern 22a are formed by the semi-additive process, for example. In more detail, first a seed layer (not shown) is formed on the interlayer insulating layer 26 and on inner surfaces of the first via holes 26x by the sputter method or the electroless plating. Then, a resist film (not shown) in which opening portions are provided in portions corresponding to the second wiring pattern 22a is formed.

Then, a metal film pattern (not shown) is formed in the opening portions in the resist film respectively by the electroplating utilizing the seed layer as the plating power feeding layer. Then, the resist film is removed, and then the second wiring pattern 22a are obtained by etching the seed layer while using the metal film pattern as a mask. In this event, the subtractive process, the full additive process, or the like may be used in addition to the semi-additive process.

With the above, an electronic parts packaging structure 5 in which the semiconductor chip 1 according to the first embodiment is mounted can be obtained.

Further, in the preferred mode, a solder resist film (not shown) in which the opening portion is provided on the second wiring patterns 22a respectively is formed on both surfaces of the core substrate 20, and then the connection portions (not shown) are defined by applying the Ni/Au plating to the second wiring patterns 22a in the opening portions.

Then, bumps of an upper electronic parts are flip-chip connected to the connection portions of the second wiring patterns 22a on the upper surface side of the core substrate 20. Also, the connection portions of the second wiring patterns 22a on the lower surface side of the core substrate 20 serve as the outer connection terminals that are connected to the mother board (wiring board).

In this case, a mode in which the first and second wiring patterns 22, 22a are stacked on both surface sides of the core substrate 20, respectively, is illustrated. But a mode in which n-layered (n is an integer that is more than 1) wiring patterns are formed on one surface or both surfaces of the core substrate 20 may be employed. Also, a plurality of similar semiconductor chips 1 may be embedded in the interlayer insulating layer and mounted by the similar steps.

As described above, in the method of manufacturing the encapsulated electronic part packaging structure in the first embodiment, first the semiconductor chip 1 on the uppermost surface of which the passivating film 14 is provided to cover the connection pads 12 is prepared. Then, the semiconductor chip 1 is mounted on the core substrate 20 in a state such that the semiconductor chip is embedded in the interlayer insulating layer 26, and then the via holes 26x are opened in the passivating film 14 and the interlayer insulating layer 26 on the connection pads 12 to expose the connection pads 12. For this reason, there is no necessity to form the opening portions, which expose the connection pads 12, in the passivating film 14 at a stage prior to the mounting of the semiconductor chip 1. As a result, the passivating film 14 is not limited to the insulating material that is easily patterned, and a wide variety of organic insulating layers or inorganic insulating layers, as described above, may be chosen appropriately to meet the purpose such that the highly-reliable passivating film dedicated to the high-performance semiconductor chip is chosen, the passivating film capable of attaining a reduction in cost is chosen, etc.

In addition, there is no necessity of providing the contact portion (Ni/Au layer) on the connection pads 12. As a result, the connection pads 12 can be made of inexpensive Cu or Al and thus a reduction in cost of the semiconductor chip 1 can be attained.

Then, the second wiring patterns 22a connected to the connection pads 12 of the semiconductor chip 1 via the via holes 26x are formed on the interlayer insulating layer 26.

In this manner, because the method of embedding the semiconductor chip 1, all surfaces of which are covered with the passivating film 14, in the interlayer insulating layer 26 in a face-up fashion and mounting, and then exposing the connection pads 12 of the semiconductor chip 1 by the laser, or the like is employed, not only a cost reduction of the semiconductor chip 1 can be achieved but also the encapsulated electronic part packaging structure that has a high reliability and is excellent in electric characteristics can be manufactured at a low cost.

Figure 8:
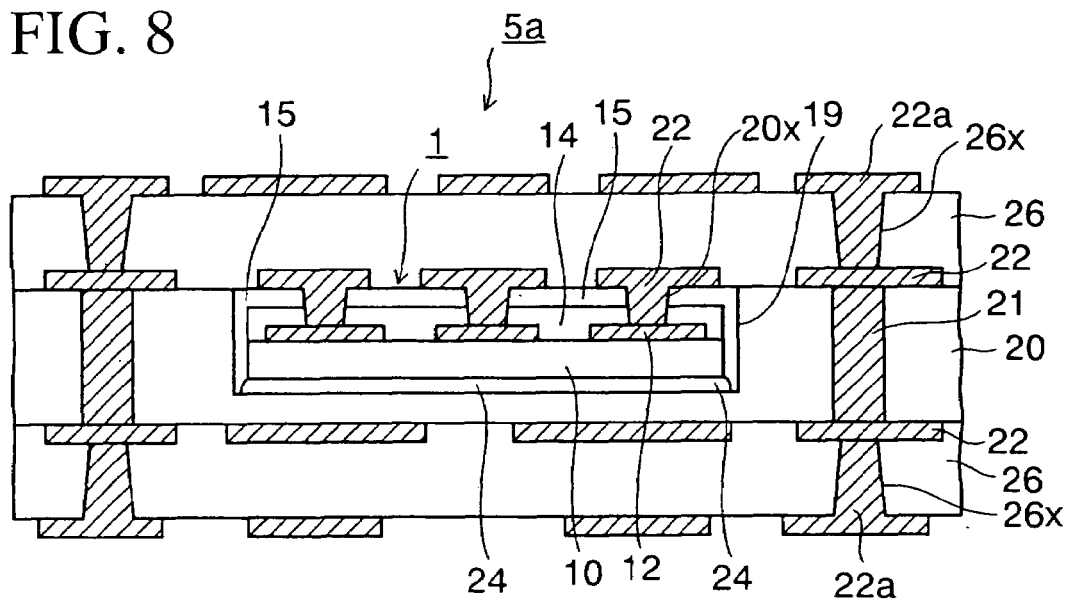
FIG. 8 is a sectional view showing a mode in which the semiconductor chip according to the first embodiment of the present invention is embedded in a core substrate.

An encapsulated electronic part packaging structure 5a having the structure that the semiconductor chip 1 according to the first embodiment is embedded in the core substrate 20 is shown in FIG. 8. As shown in FIG. 8, first a recess portion 19 is formed in the center portion of the core substrate 20 having the first wiring patterns 22 thereon. Then, the semiconductor chip 1 is secured onto a bottom portion of the recess portion 19 by the adhesive layer 24 to direct the connection pads 12 upward. In this manner, in FIG. 8, the recess portion 19 of the core substrate 20 serves as the mounted body and the semiconductor chip 1 is mounted onto the bottom portion of the recess portion 19. Then, a resin layer 15 is filled on the semiconductor chip 1 and in a clearance between the semiconductor chip 1 and the recess portion 19 to planarize the recess portion 19.

Then, first via holes 20x are formed in the passivating film 14 and the resin layer 15 on the connection pads 12 of the semiconductor chip 1. Then, the first wiring patterns 22 connected to the connection pads 12 of the semiconductor chip 1 via the first via holes 20x are formed.

Then, the second wiring patterns 22a connected to the first wiring patterns 22 via the via holes 26x provided in the interlayer insulating layer 26 are formed on both surface sides of the core substrate 20.

Figure 9:
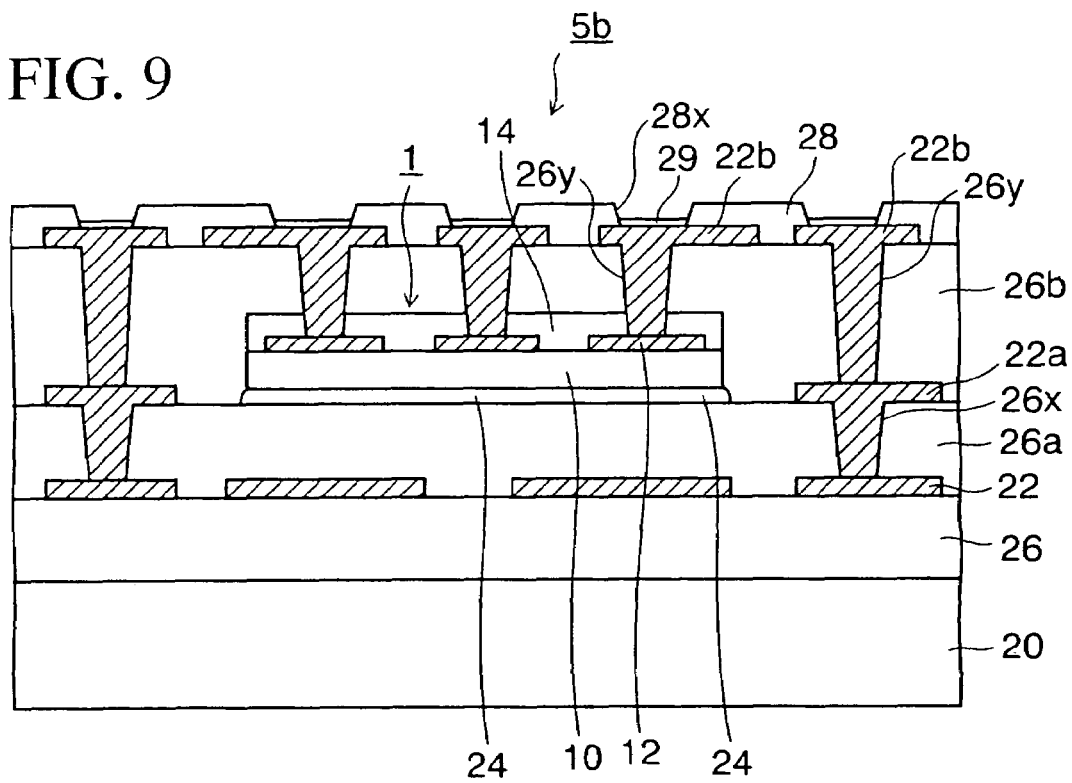
FIG. 9 is a sectional view showing a mode in which the semiconductor chip according to the first embodiment of the present invention is mounted on an interlayer insulating layer.

An encapsulated electronic part packaging structure 5b having the structure in which the semiconductor chip 1 according to the first embodiment is mounted on the interlayer insulating layer 26 is shown in FIG. 9. As shown in FIG. 9, at first the first interlayer insulating layer 26 is formed on the core substrate 20 and then the first wiring patterns 22 are formed thereon. Then, a second interlayer insulating layer 26a for covering the first wiring patterns 22 is formed, and then the first via holes 26x are formed in the second interlayer insulating layer 26a on the first wiring patterns 22. Then, the second wiring patterns 22a connected to the first wiring patterns 22 via the first via holes 26x are formed in the second interlayer insulating layer 26a.

Then, the back surface of the semiconductor chip 1 is secured onto the second interlayer insulating layer 26a (mounted body) by the adhesive layer 24, and then a third interlayer insulating layer 26b for covering the semiconductor chip 1 is formed. Then, second via holes 26y are formed in portions of the passivating film 14 and the third interlayer insulating layer 26b on the connection pads 12 of the semiconductor chip 1. At this time, the second via holes 26y are formed simultaneously in portions of the third interlayer insulating layer 26b on the second wiring patterns 22a.

In addition, third wiring patterns 22b connected to the connection pads 12 of the semiconductor chip 1 and the second wiring patterns 22a via the second via holes 26y respectively are formed on the third interlayer insulating layer 26b.

Then, a solder resist film 28 in which opening portions 28x are provided on the third wiring patterns 22b is formed, and then a connection portion 29 made of the Ni/Au layer is provided onto the third wiring patterns 22b in the opening portions 28x.

(Second Embodiment)

Figure 10:
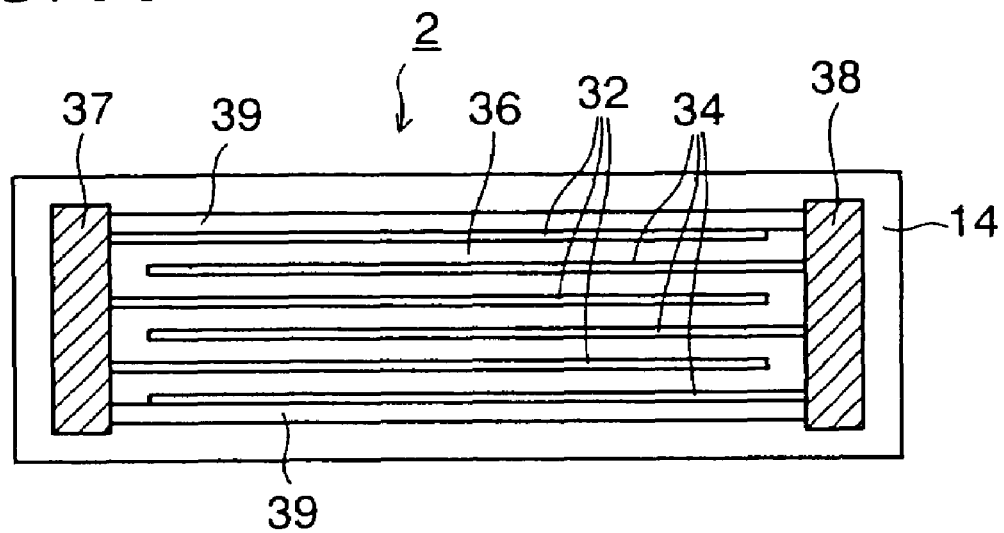
FIG. 10 is a sectional view showing a stacked capacitor chip (electronic parts) according to a second embodiment of the present invention.
Figure 11:
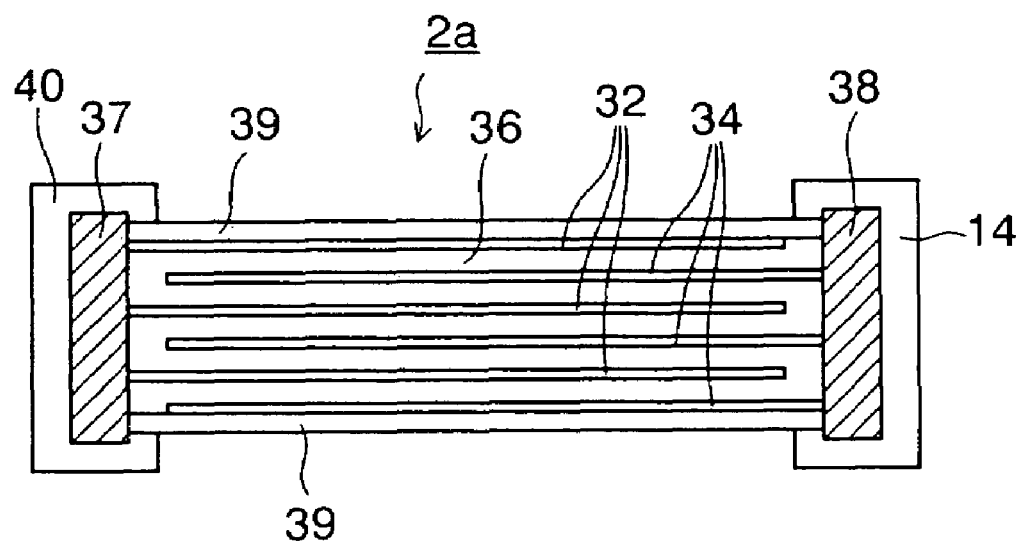
FIG. 11 is a sectional view showing a stacked capacitor chip (electronic parts) according to a variation of the second embodiment of the present invention.

FIG. 10 and FIG. 11 are sectional views showing an electronic part according to a second embodiment of the present invention respectively, and FIGS. 12A to 12D are sectional views showing a method of manufacturing an encapsulated electronic part packaging structure according to the second embodiment of the present invention. In the second embodiment, explanation will be made while taking a stacked capacitor chip as an example of the electronic part hereunder. In the second embodiment, detailed explanation of the same steps as those in the first embodiment will be omitted herein.

As shown in FIG. 10, in a stacked capacitor chip 2 (electronic part) of the second embodiment, a capacitor portion is composed of a plurality of first electrode layers 32 and a plurality of second electrode layers 34 via a dielectric layer 36. The first electrode layers 32 are connected to a first connection terminal 37 located on one end side and the second electrode layers 34 are connected to a second connection terminal 38 located on the other side. Then, a protection layer 39 for protecting the capacitor portion is formed on an upper surface and a lower surface of the stacked semiconductor chip 2. Then, the passivating film 14 is coated on all surfaces (upper surface, all side surfaces, and lower surface) of the stacked capacitor chip 2.

In the stacked capacitor chip 2 of the second embodiment, because the first and second connection terminals 37, 38 made of a metal of Cu or the like are covered with the passivating film 14, the corrosion of the first and second connection terminals 37, 38 can be prevented.

Also, in the stacked capacitor chip 2 of the second embodiment, like the first embodiment, the stacked capacitor chip 2 is embedded in the insulating layer and mounted, then the opening portions are formed in the passivating film 14 and the insulating film on the first and second connection terminals 37, 38 respectively, and then the first and second connection terminals 37, 38 and the wiring patterns are mutually connected.

For this reason, in the stacked capacitor chip 2 of the second embodiment, even though the passivating film 14 is formed, no opening portion need be provided in the passivating film 14 on the first and second connection terminals 37, 38 in the stage before the stacked capacitor chip 2 is mounted. Therefore, the passivating film 14 is not limited to the insulating material that is easily patterned, and thus can be formed of various insulating materials.

A stacked capacitor chip 2a according to a variation of the second embodiment is shown in FIG. 11. In the stacked capacitor chip 2a in the variation, the first and second connection terminals 37, 38 are covered selectively with the passivating film 14 and the protection layer 39 is exposed from other portions. The passivating film 14 of the stacked capacitor chip 2a in the variation can be obtained by forming selectively the insulating layer on exposed surfaces of the first and second connection terminals 37, 38 by means of the electrodeposition process, or the like.

Next, a method of mounting the stacked capacitor chip 2 of the second embodiment will be explained hereunder.

Figure 12A:
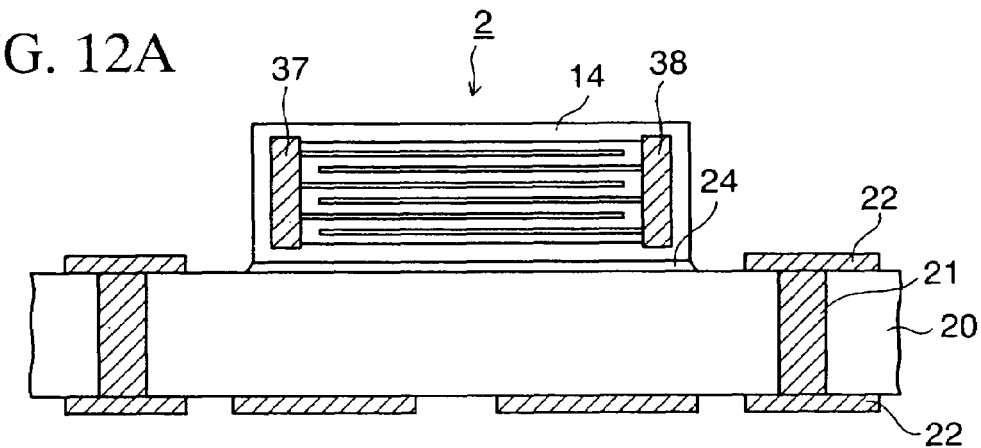
FIGS. 12A to 12D are sectional views showing a method of manufacturing an encapsulated electronic part packaging structure according to the second embodiment of the present invention.

As shown in FIG. 12A, at first the core substrate 20 (mounted body) having the first wiring patterns 22 similar to the first embodiment thereon is prepared. Then, one surface of the above stacked capacitor chip 2 is adhered onto the core substrate 20 by the adhesive layer 24.

Figure 12B:
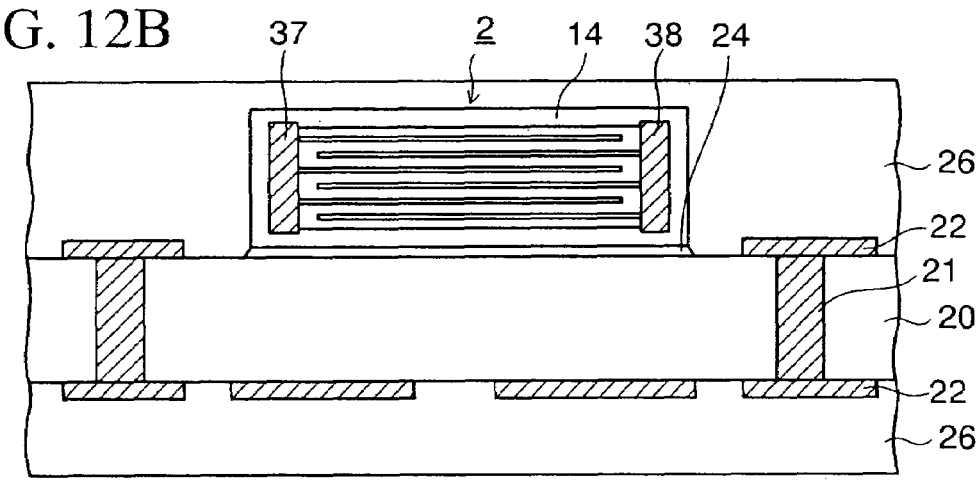
Figure 12C:
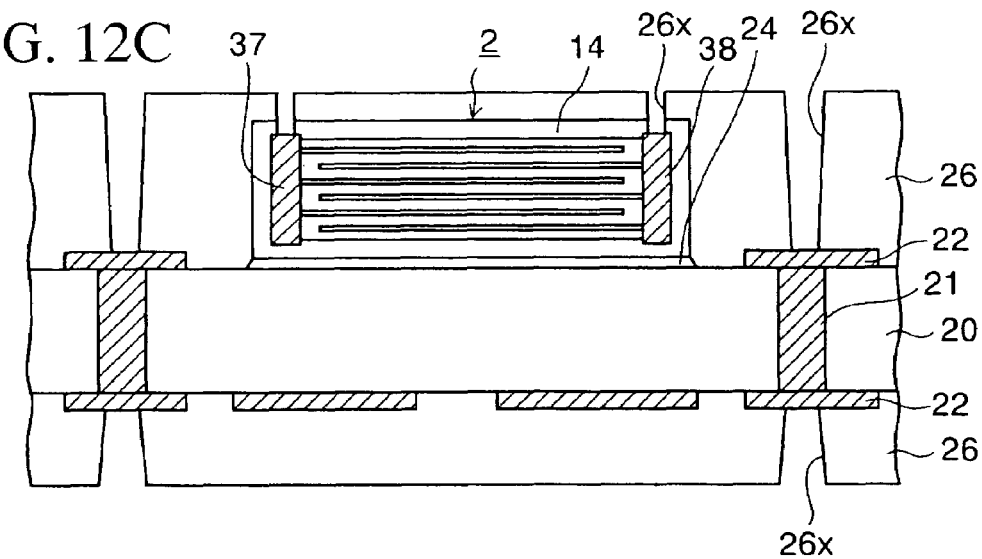

Then, as shown in FIG. 12B, the interlayer insulating layer 26 for covering the stacked capacitor chip 2 is formed on the upper surface side of the core substrate 20. Then, the interlayer insulating layer 26 for covering the first wiring patterns 22 is also formed on the lower surface side of the core substrate 20. Then, as shown in FIG. 12C, the via holes 26x are formed in portions of the passivating film 14 and the interlayer insulating layer 26 on the first and second connection terminals 37, 38 of the stacked capacitor chip 2 by the laser, or the like. At this stage, connection portions of the first and second connection terminals 37, 38 of the stacked capacitor chip 2 are exposed. At this time, the via holes 26x are also formed in portions of the interlayer insulating layer 26 on the first wiring patterns 22. In addition, the via holes 26x are also formed in portions of the interlayer insulating layer 26 on the first wiring patterns 22 on the lower surface side of the core substrate 20.

Figure 12D:
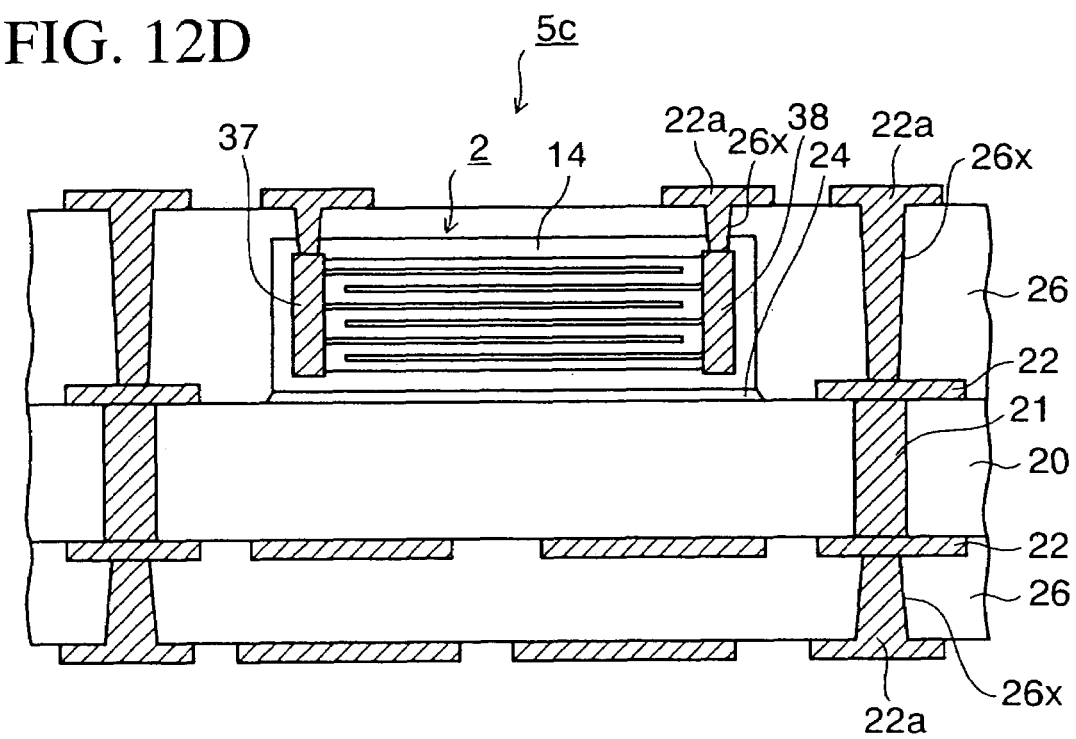

Then, as shown in FIG. 12D, the second wiring patterns 22a connected to the first and second connection terminals 37, 38 of the stacked capacitor chip 2 and the first wiring patterns 22 via the via holes 26x are formed on the interlayer insulating layer 26 on the upper surface side of the core substrate 20. In addition, the second wiring patterns 22a connected to the first wiring patterns 22 via the via holes 26x are formed on the lower surface side of the core substrate 20.

With the above, an encapsulated electronic part packaging structure 5c in which the stacked capacitor chip 2 of the second embodiment is mouted is obtained. In the preferred mode, as explained in the first embodiment, the bumps of the upper electronic part are flip-chip connected to the connection portions of the second wiring patterns 22a on the upper surface side of the core substrate 20. Also, the connection portions of the second wiring patterns 22a on the lower surface side of the core substrate 20 serve as the external connection terminals that are connected to the mother board (wiring substrate) via the bumps.

The method of manufacturing the encapsulated electronic part packaging structure according to the second embodiment can achieve the similar advantages to the first embodiment.

Here, in the second embodiment, the stacked capacitor chip 2 is cited as an instance of the electronic parts, but a chip resistor may be employed.

(Third Embodiment)

Figure 13:
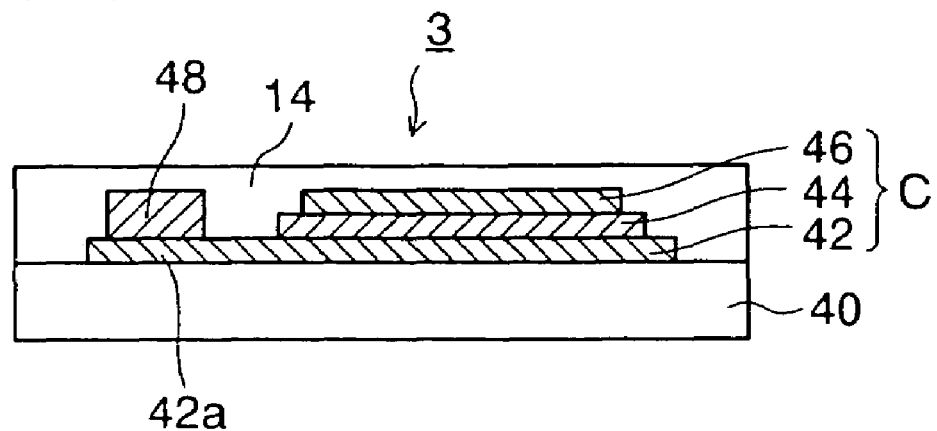
FIG. 13 is a sectional view showing a thin film capacitor (electronic parts) according to a third embodiment of the present invention.
Figure 14:
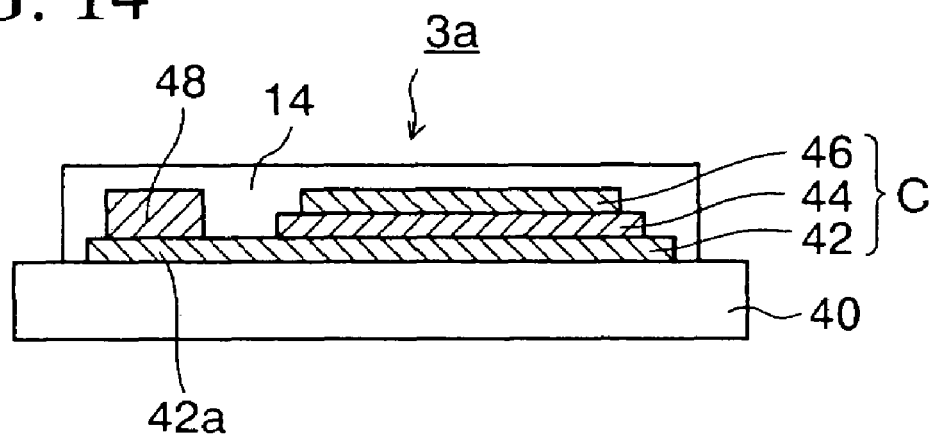
FIG. 14 is a sectional view showing a thin film capacitor (electronic parts) according to a variation of the third embodiment of the present invention.

FIG. 13 and FIG. 14 are sectional views showing an encapsulated electronic part according to a third embodiment of the present invention, respectively, and FIGS. 15A to 15D are sectional views showing a method of manufacturing an encapsulated electronic part packaging structure according to the third embodiment of the present invention. In the third embodiment, explanation will be made while taking a thin film capacitor as an example of the electronic parts hereunder. In the third embodiment, detailed explanation of the same steps as those in the first embodiment will be omitted herein.

As shown in FIG. 13, in a thin film capacitor 3 (electronic parts) of the third embodiment, a lower electrode 42, a dielectric film 44, and an upper electrode 46 are formed sequentially on a substrate 40, whereby a capacitor C is constructed. As the substrate 40, an insulating substrate or a conductive substrate (semiconductor substrate) on which an insulating layer is formed may be employed. An extended portion 42a that is extended outward from the dielectric film 44 is provided to the lower electrode 42, and an auxiliary electrode 48 is formed on the extended portion 42a. The auxiliary electrode 48 is provided to lift the connection portion of the lower electrode 42 up to a height same as an upper surface of the upper electrode 46. Then, the upper electrode 46 and the auxiliary electrode 48 function as the connection terminal that is connected to the wiring patterns respectively.

Then, in the thin film capacitor 3 of the present embodiment, the passivating film 14 is formed on the overall upper surface of the substrate 40 containing a capacitor area.

In the thin film capacitor 3 of the third embodiment, like the first embodiment, the thin film capacitor 3 is embedded in the insulating layer and mounted, then the via holes are opened in portions of the passivating film 14 and the insulating film on the upper electrode 46 and the auxiliary electrode 48 connected to the lower electrode 42, and then the wiring patterns are connected electrically to the upper electrode 46 and the auxiliary electrode 48.

For this reason, in the thin film capacitor 3 of the third embodiment, like the semiconductor chip 1 of the first embodiment, no opening portion must be provided in the passivating film 14 on the upper electrode 46 and the auxiliary electrode 48 in the stage before the thin film capacitor 3 is mounted. Therefore, the passivating film 14 is not limited to the insulating material that is easily patterned, and thus can be formed of various insulating materials.

A thin film capacitor 3a according to a variation of the third embodiment is shown in FIG. 14. In the thin film capacitor 3a in the variation, the capacitor portion (the lower electrode 42, the dielectric film 44, the upper electrode 46, and the auxiliary electrode 48) is covered selectively with the passivating film 14, and the substrate 40 is exposed from remaining portions. The passivating film 14 of the thin film capacitor 3a in the variation can be obtained by forming selectively the insulating layer on exposed surfaces of the lower electrode 42, the dielectric film 44, the upper electrode 46, and the auxiliary electrode 48 by virtue of the electrodeposition process, or the like.

Next, a method of mounting the thin film capacitor 3 of the third embodiment will be explained hereunder.

Figure 15A:
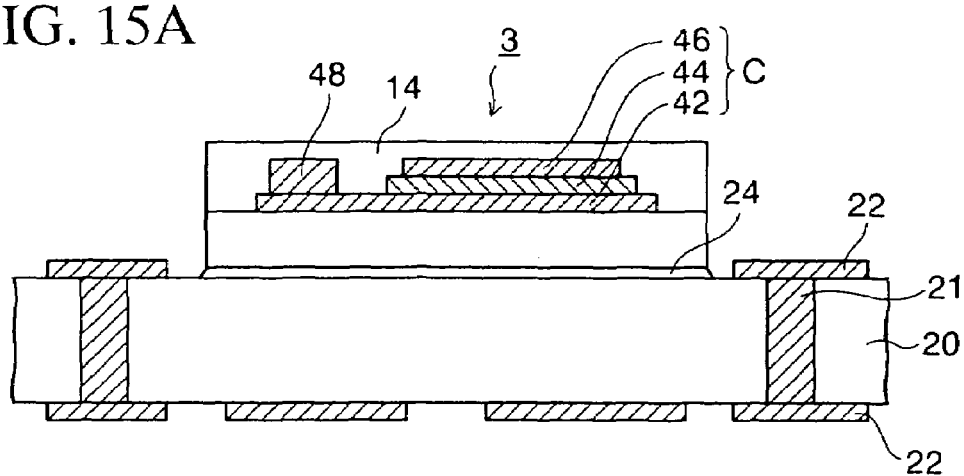
FIGS. 15A to 15D are sectional views showing a method of manufacturing an encapsulated electronic part packaging structure according to the third embodiment of the present invention.

As shown in FIG. 15A, first the core substrate 20 (mounted body) having the first wiring patterns 22 similar to the first embodiment thereon is prepared. Then, the back surface of the thin film capacitor 3 is adhered onto the core substrate 20 by the adhesive layer 24 to direct upward the surface of the thin film capacitor 3 on which the capacitor C is provided.

Figure 15B:
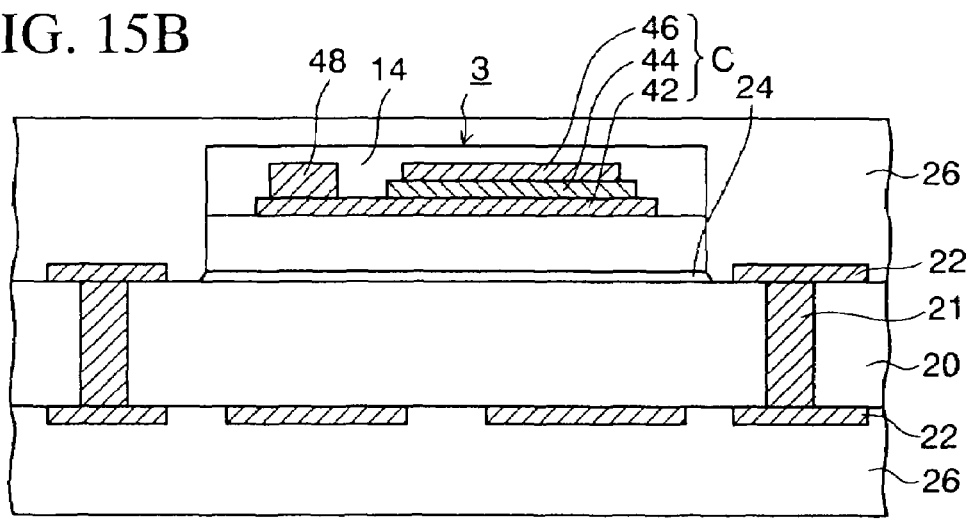
Figure 15C:
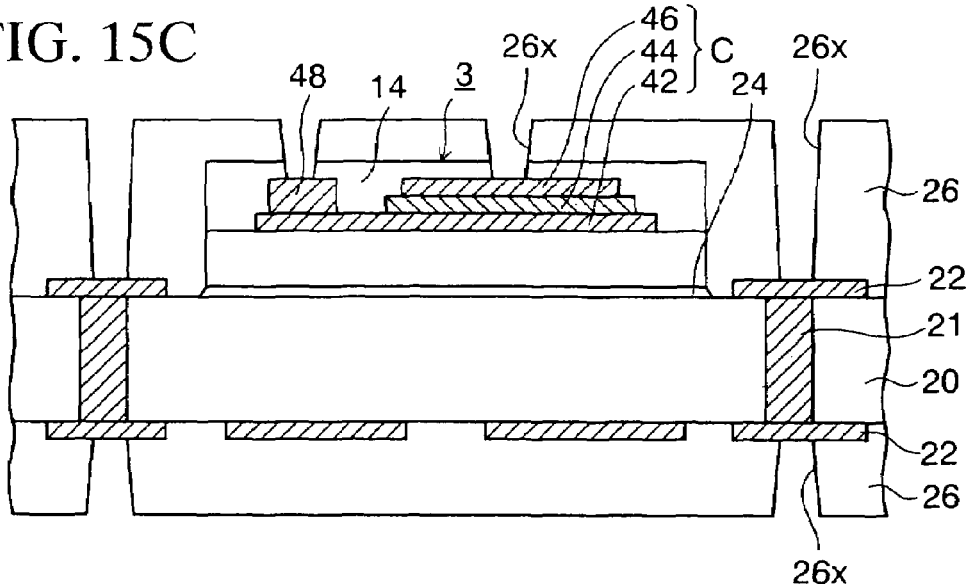

Then, as shown in FIG. 15B, the interlayer insulating layer 26 for covering the thin film capacitor 3 is formed on the upper surface side of the core substrate 20. Then, the interlayer insulating layer 26 for covering the first wiring patterns 22 is also formed on the lower surface side of the core substrate 20. Then, as shown in FIG. 15C, the via holes 26x are formed in portions of the passivating film 14 and the interlayer insulating layer 26 on the upper electrode 46 and the auxiliary electrode 48 connected to the lower electrode 42 of the thin film capacitor 3 by the laser, or the like. At this stage, connection portions of the upper electrode 46 and the auxiliary electrode 48 of the thin film capacitor 3 are exposed. At this time, the via holes 26x are also formed in portions of the interlayer insulating layer 26 on the first wiring patterns 22. In addition, the via holes 26x are also formed in portions of the interlayer insulating layer 26 on the first wiring patterns 22 on the lower surface side of the core substrate 20.

Figure 15D:
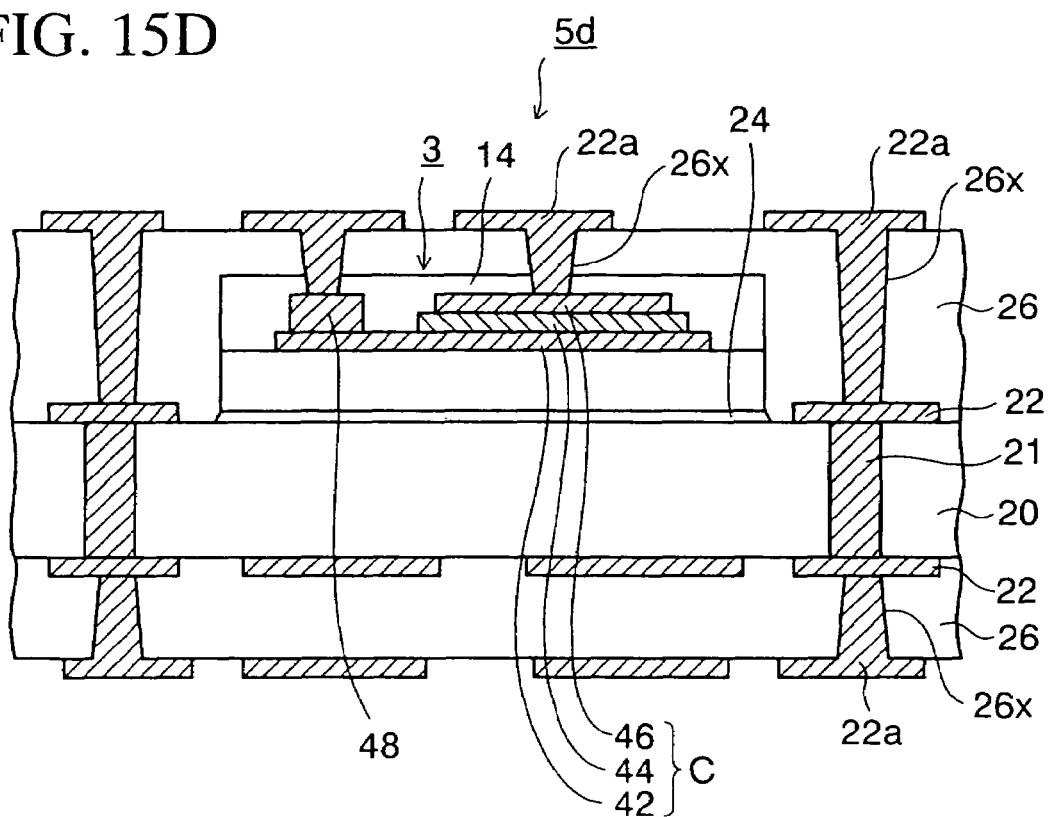

Then, as shown in FIG. 15D, the second wiring patterns 22a connected to the upper electrode 46 and the auxiliary electrode 48 of the thin film capacitor 3 via the via holes 26x respectively are formed on the interlayer insulating layer 26 on the upper surface side of the core substrate 20. At this time, the second wiring patterns 22a connected to the first wiring patterns 22 via the via holes 26x are formed simultaneously. In addition, the second wiring patterns 22a connected to the first wiring patterns 22 via the via holes 26x are formed on the interlayer insulating layer 26 on the lower surface side of the core substrate 20.

With the above, an encapsulated electronic part packaging structure 5d in which the thin film capacitor 3 of the third embodiment is mounted is obtained. In the preferred mode, as explained in the first embodiment, the bumps of the upper electronic parts are flip-chip connected to the connection portions of the second wiring patterns 22a on the upper surface side of the core substrate 20. Also, the connection portions of the second wiring patterns 22a on the lower surface side of the core substrate 20 serve as the external connection terminals that are connected to the mother board (wiring substrate) via the bumps.

The method of manufacturing the electronic parts packaging structure according to the third embodiment can achieve the similar advantages to the first embodiment.

Here, in the third embodiment, the thin film capacitor 3 is cited as an instance of the electronic parts. But various electronic modules in which the electrodes and the passive elements such as inductors, resistors, capacitors, or the like connected to the electrodes are formed on the substrate 40 by the thin film steps and then these passive parts and the electrodes are covered with the passivating film 14 may be employed.

What is claimed is:

1. An encapsulated electronic part packaging structure, the electronic part, before being mounted on a mounting body and being individual, comprising:
   a connection terminal connected electrically to a wiring pattern formed on the mounted body; and
   a passivating film formed only on the electronic part and covering the connection terminal, such that there is no opening portion formed in the passivating film over the connection terminal and the passivating film does not extend beyond an outer periphery of the electronic part;
   wherein, when the electronic part is mounted on the mounted body, the electronic part is embedded in an insulating layer and mounted to direct the connection terminal upward and also the connection terminal is connected electrically to the wiring pattern via a via hole that is provided in the insulating layer and the passivating film the via hole that is provided in the insulating layer and the passivating film, an inner surface of the insulating layer and inner surface of the passivating film constitute an identical surface.

2. The encapsulated electronic part packaging structure according to claim 1, wherein the electronic part is any one of a semiconductor chip on one surface side of which the connection terminal is provided, a stacked capacitor chip in which the connection terminal is provided on one end side and other end side respectively, and a thin film capacitor in which a dielectric film is arranged between a lower electrode and an upper electrode, and the lower electrode and the upper electrode serve as the connection terminal.

3. The encapsulated electronic part packaging structure according to claim 1, wherein material of the passivating film is any one selected from a group consisting of epoxy resin, polyimide resin, phenol resin, novolak resin, silicon dioxide, aluminum oxide, and tantalum oxide.

4. The encapsulated electronic part packaging structure according to claim 1, wherein the passivating film is made of a non-photosensitive resin.

5. The encapsulated electronic part packaging structure according to claim 1, wherein the passivating film covers selectively the connection terminal.

6. The encapsulated electronic part packaging structure according to claim 1, wherein the electronic part comprises a stacked capacitor chip on one end side and other end side of which the connection terminal is provided respectively, and the passivating film covers an overall surface of the stacked capacitor chip.

* * * * *